United States Patent [19]

Lush et al.

[11] Patent Number: 4,872,092
[45] Date of Patent: Oct. 3, 1989

[54] COUPLER TERMINAL BLOCK

[75] Inventors: Steven Lush, Epsom, United Kingdom; Siegfried Kerbstat, Detmold, Fed. Rep. of Germany

[73] Assignee: C. A. Weidmüller GmbH & Co., Fed. Rep. of Germany

[21] Appl. No.: 928,846

[22] Filed: Nov. 7, 1986

[30] Foreign Application Priority Data

Nov. 13, 1985 [EP] European Pat. Off. ........ 85114305.8

[51] Int. Cl.⁴ ........................ H01R 9/26; H01R 13/66
[52] U.S. Cl. .................................... 361/426; 439/620; 439/716
[58] Field of Search .................... 174/68.5, 126.4; 439/620, 709, 712, 715, 716, 717, 718; 361/395, 399, 412, 426; 524/609

[56] References Cited

U.S. PATENT DOCUMENTS

| | | | |
|---|---|---|---|
| 3,992,074 | 11/1976 | Rymer | 439/716 |
| 4,218,724 | 8/1980 | Kaufman | 361/395 |
| 4,281,038 | 7/1981 | Ambros et al. | 524/609 X |
| 4,373,259 | 2/1983 | Motsch | 228/180.1 X |
| 4,399,488 | 8/1983 | Ruwe et al. | 361/412 |
| 4,513,064 | 4/1985 | Moscus | 361/412 X |

*Primary Examiner*—Eugene F. Desmond
*Assistant Examiner*—Stephen Zagrobelny
*Attorney, Agent, or Firm*—Laubscher, Presta & Laubscher

[57] ABSTRACT

A serial terminal block includes a housing of an insulating material, including at least one lateral closing wall having at least one free zone at an internal side thereof. Printed strip conductors are provided on the free zone for the surface mounting of electrical/electronic elements. The printed strip conductors are photomechanically printed. The electrical/electronic elements are glued and soldered to the strip conductors in a soldering bath. The free zone is flat. The insulating material housing consists of a material which is resistant to temperatures of up to 200° C., such as epoxy resin or a ceramic material.

6 Claims, 1 Drawing Sheet

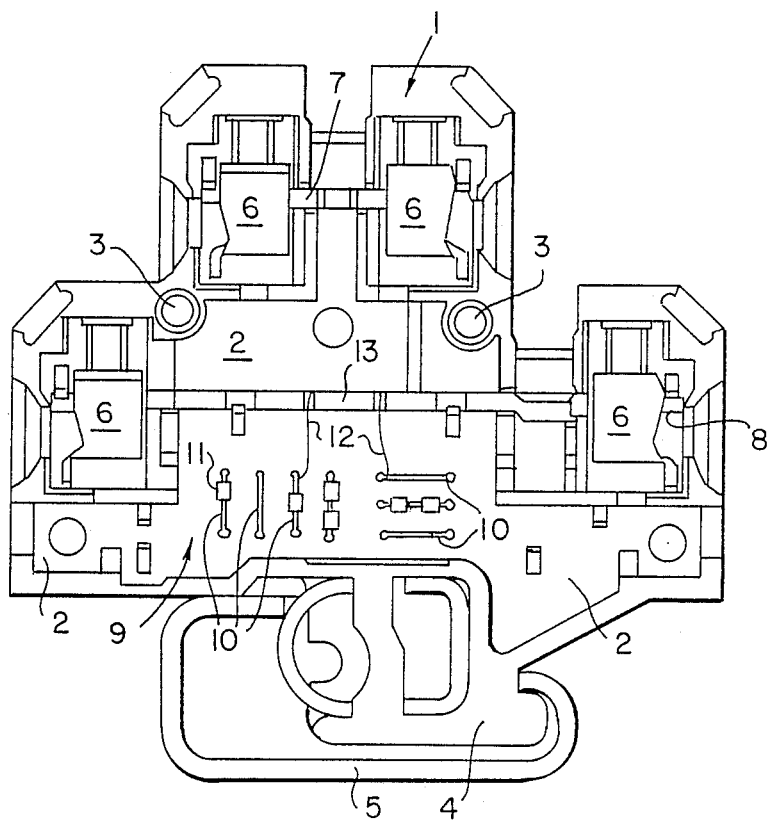

COUPLER TERMINAL BLOCK

BACKGROUND OF THE INVENTION

The present invention relates to electrically coupling terminal arrangements in general, and more particularly to a terminal unit or block capable of being arranged in a row with other terminal units or blocks of the same or similar type.

There are already known various constructions of terminal blocks which are capable of being arranged in a row or series with similar units and, therefore, will be referred to herein as serial terminal blocks, among them such which have a housing of an insulating material which includes at least one lateral closing wall. Serial terminal blocks of this type are known in a variety of constructions as far as the connecting techniques employed therein, the number of tiers of connecting locations, and the configuration and construction of the housing are concerned. What is common to such known serial terminal blocks is that, in addition to diverse connecting elements and current bars electrically connecting such connecting elements, there are provided in the interior of the insulating material housing respective free spaces which have heretofore been either unused, or used only for the accommodation of specially fitted small conductor plates with electrical/electronic elements arranged on such conductor plates. This makes the construction of the respective terminal block quite expensive. What makes the known constructions of the serial terminal unit even more expensive are the heretofore also customarily used free wire connections interconnecting the individual structural elements in the interior of the terminal block spaces.

SUMMARY OF THE INVENTION

Accordingly, it is a general object of the present invention to avoid the disadvantages of the prior art.

More particularly, it is an object of the present invention to provide a serial terminal block which does not possess the drawbacks of the known blocks of this type.

Still another object of the present invention is to devise a terminal block of the type here under consideration which renders it possible in the easiest imaginable manner to establish electrical/electronic circuits and further connections in the interior of the insulating housing of the terminal block.

It is yet another object of the present invention to design the above terminal block in such a manner as to be able to dispense with the heretofore customarily used separate conductor plates.

A concomitant object of the present invention is so to construct the block of the above type as to be relatively simple in construction, inexpensive to manufacture, easy to use, and yet reliable in operation.

In keeping with these ojects and others which will become apparent hereafter, one feature of the present invention resides in a serial terminal block which comprises a housing of an insulating, highly temperature resistant material, this housing including at least one lateral closing wall having at least one free zone at an internal side thereof; and printed strip conductors on the free zone for the surface mounting of electrical/electronic elements.

In this connection, it has been established that the formation of such free zones at the inner side of the lateral closing wall by transfer and partially also by elimination of the reinforcing ribs, arresting elements for the connection to the next following insulating material housing in a serial clamping unit arrangement, and the like, which are frequently arranged at these zones in known blocks of this type, can be achieved without encountering any difficulties. It has also been established that the inner sides of the serial terminal blocks can also have strip conductors printed thereon. Photomechanical printing has been found to be particularly suited for this purpose.

The electrical/electronic elements which are to be employed here are such that they are suited for the so-called surface mounting, that is such that can particularly be glued onto the strip conductors, inasmuch as especially such connecting techniques which would require the perforation of the lateral covering wall of the insulating material housing toward the exterior cannot be used. In the sense of the surface mounting, the insulating material housing, together with the glued-on elements, is then passed through a soldering bath in order to also assure the electrical connection between the strip conductors and the elements in this manner. Inasmuch as temperatures in excess of 200° C. can be encountered during the performance of this technique, the insulating material housing of such a serial terminal block must be in this sense resistant to such high temperatures. In this sense, housings of, for instance, epoxy resin are currently preferred. However, even a ceramic material can be used without encountering any difficulties for the fabrication of the insulating material housing.

When reference is being had to electrical/electronic elements, it is to be understood that this expression embraces more than just structural components for the formation of corresponding circuits. Rather, even wire pieces, for example, can be mechanically and electrically rigidly arranged in this manner on the strip conductors. These wire pieces can then be connected with the current bar or bars in correspondence with the function thereof in an electrically conductive manner, for instance, by soldering.

In this construction, there exists, on the one hand, the possibility that the manufacturer of the serial terminal blocks makes available to prospective consumers or users only the serial terminal blocks which are provided with the printed strip conductors and leaves it to the user to decide which electrical/electronic circuits and connections the user wishes to additionally effectuate by resorting to the use of the surface mounting technique. However, it is particularly advantageous in this connection when certain circuits and connecting possibilities which are required time and time again are directly embodied in serial terminal blocks of this kind by the manufacturer, in which case these circuits and connections are directly made available in an integrated form with the serial terminal block or with a terminal assembly constituted by a plurality of such serial terminal blocks.

BRIEF DESCRIPTION OF THE DRAWING

The present invention will be described below in more detail with reference to the sole FIGURE of the accompanying drawing which is a side elevational view of a serial terminal units of the present invention, which is open to one side.

DETAILED DESCRIPTION OF THE PREFERRED EMBODIMENT

Referring now to the sole FIGURE of the drawing in detail, it may be seen that the reference numeral 1 has been used therein to identify a housing of a two-tier terminal block of the present invention which is open at one side and which is to be arranged in a row or series with other blocks of the same or similar type. The housing 1 is made of an insulating material and has only one lateral closing wall 2. The housing 1 is further provided with arresting elements or stops 3 for arrestingly connecting the housing 1 with neighboring a terminal block and similar serial housings arranged in the same row to form a coupler terminal block therewith. In addition, the housing 1 is provided with a customary arresting foot 4 for arrestingly mounting the serial terminal unit housing 1 on a standardized carrier rail 5.

In the illustrated embodiment of the present invention, the two-tier serial terminal block is implemented by resorting to the use of threaded connector technology. Two clamping yoke connectors 6 of a customary construction are arranged in each of the tiers and are connected with one another in the respective tier by current bars 7 and 8.

Now, in the illustrated embodiment, a flat-surface free zone 9 is provided underneath the lower current bar at the inner side of the lateral closing wall by the omission or interruption and transfer of reinforcing ribs, molded portions, arresting elements and the like. Strip conductors 10 are printed on the inner side of the closing wall 2 of the insulating material housing 1 at the free zone 9. Photomechanical printing is especially suited for the production of these strip conductors 10. Electrical/electronic components, for instance, in the form of diverse structural elements or modules 11, are stationarily mounted on the strip conductors 10 by resorting to the surface mounting techniques in such a manner as to be mechanically rigidly and electrically conductively connected with the respective strip conductors 10. To this end, the electrical/electronic structural elements 11 are, more particularly, first connected by gluing, whereupon the insulating material housing 1 with the printed-on strip conductors 10 and the glued-on structural elements 11 is passed through a soldering bath, so that the solder of the bath forms the electrical connections between the strip conductors 10 and the structural elements 11. When this particular connecting technique is being used, there may be encountered temperatures of more than 200° C. in the soldering bath, so that the insulating material housing 1 has to be resistant in this sense to such relatively high temperatures. Thus, the housing 1 may consist, for instance, of an epoxy resin. However, the housing 1 may just as well be made of a ceramic material.

There can also be stationarily mounted on the strip conductors 10, by resorting to the surface mounting techniques, electrical elements in the form of simple conductive wire pieces 12, the other ends of which are then soldered, for the establishment of the desired electric connections, to the current bar 8 which is then advantageously provided with notches 13.

It will be appreciated that, in a deviation from the illustrated embodiment, the above-mentioned formation of the free zones and their above-discussed utilization can also be effected in serial terminal blocks which have only one tier or in serial terminal blocks which have three or more tiers, and that this approach can also be used in serial terminal blocks which are completely or partially equipped in accordance with connecting techniques different from the threaded connector technique mentioned above.

While the present invention has been described and illustrated herein as embodied in a specific construction of a coupler terminal block, it is not limited to the details of this particular construction, since various modifications and structural changes are possible and contemplated by the present invention. Thus, the scope of the present invention will be determined exclusively by the appended claims.

What is claimed is:

1. A serial terminal block, comprising
   (a) a unitary housing formed of an insulating, high-temperature resistant material and defining a chamber, said housing including
      (1) means for mounting said housing on a carrier rail, whereby a plurality of terminal blocks may be arranged adjacent each other to define a terminal block assembly; and
      (2) an integral end wall for closing one end of said housing chamber, the other end of said housing chamber being open for being covered by another terminal block or an end cover, said end wall havng an inner surface including at least one imperforate free zone; and
   (b) a plurality of printed strip conductors mounted on the surface of said end wall within said imperforate free zone, thereby to enable electrical components to be mounted on said wall surface and electrically connected with said conductors without penetrating said housing wall.

2. A terminal block as defined in claim 1, wherein said conductors are photomechanically printed on said end wall surface.

3. A terminal blcok as defined in claim 2, wherein said end wall free zone is flat.

4. A terminal block as defined in claim 3, wherein said housing material comprises an epoxide resin.

5. A terminal block as defined in claim 3, wherein said housing material comprises a ceramic.

6. A terminal block as defined in claim 3, and further comprising electrical components adhesively mounted on said wall surface within said flat free zone adjacent said conductors and electrically connected with said conductors via a solder bath.

* * * * *